(12) United States Patent
Moore

(10) Patent No.: US 12,446,194 B2
(45) Date of Patent: Oct. 14, 2025

(54) MULTIPLE PCB COOLING MODULE ASSEMBLY

(71) Applicant: Panasonic Automotive Systems Company of America, Division of Panasonic Corporation of North America, Peachtree City, GA (US)

(72) Inventor: Michael Darrill Moore, Senoia, GA (US)

(73) Assignee: Panasonic Automotive Systems America, LLC., Peachtree City, GA (US)

( * ) Notice: Subject to any disclaimer, the term of this patent is extended or adjusted under 35 U.S.C. 154(b) by 213 days.

(21) Appl. No.: 18/473,827

(22) Filed: Sep. 25, 2023

(65) Prior Publication Data

US 2024/0121918 A1 Apr. 11, 2024

Related U.S. Application Data

(60) Provisional application No. 63/413,889, filed on Oct. 6, 2022.

(51) Int. Cl.
H05K 7/20 (2006.01)

(52) U.S. Cl.
CPC ....... *H05K 7/2049* (2013.01); *H05K 7/20272* (2013.01)

(58) Field of Classification Search
CPC ............... H05K 7/20236; H05K 7/203; H05K 7/20272; H05K 7/20772; H05K 7/20781; H05K 7/20336; H05K 7/20809; H05K 7/2039; H05K 7/1497; H05K 7/20127; H05K 7/20145; H05K 7/20309; H05K 7/2049; H05K 7/20409; H05K 7/208; H05K 7/20818; H05K 1/0203; H05K 1/141; H05K 1/0272; H05K 1/181; H05K 2201/042; H05K 2201/064; H05K 5/0213;

(Continued)

(56) References Cited

U.S. PATENT DOCUMENTS 4,970,868 A * 11/1990 Grebe .................. H01L 23/445
62/51.1
6,629,426 B2 * 10/2003 Paul ...................... H10N 60/30
361/689

(Continued)

OTHER PUBLICATIONS

CN115052442, Zhang, Safety Protection Device of Computer Network (Year: 2022).*

(Continued)

*Primary Examiner* — Michael A Matey
(74) *Attorney, Agent, or Firm* — Laurence S. Roach, Esq.

(57) ABSTRACT

A cooling arrangement for electronics includes a plurality of modular electronics enclosures. Each modular electronics enclosure includes at least one electronic component, and a heat sink engaging the electronic component. The cooling arrangement also includes a cold box having a plurality of recesses. Each of the recesses is at least partially defined by at least one corresponding wall having at least one channel therein carrying liquid coolant. Each of the recesses receives a respective one of the modular electronics enclosures. The cold box includes a plurality of springs each biasing a respective heat sink of a respective modular electronics enclosure against a corresponding one of the walls.

20 Claims, 8 Drawing Sheets

(58) Field of Classification Search
CPC .... H05K 7/023; H05K 7/1405; H05K 7/1487; H05K 7/1488; H05K 7/1489; H05K 7/20154; H05K 7/20254; H05K 7/20263; H05K 7/2029; H05K 7/20281; H05K 7/20327; H05K 7/20363; H05K 7/20372; H05K 7/20636; H05K 7/20645; H05K 7/20709; H05K 7/20745; H05K 7/20836; H05K 7/2089; G06F 2200/201; G06F 1/206; G06F 1/183; F28D 15/02; F28D 15/0266; F28D 9/0025; H01L 23/445; H01L 21/4882; H01L 23/427; H01L 23/473; B22D 19/0072; F17C 2203/0366; F28F 9/02; F28F 13/06; G11C 11/44; H01F 6/04; H02G 5/10; Y10T 29/49359
See application file for complete search history.

(56) References Cited

U.S. PATENT DOCUMENTS

| | | | | |
|---|---|---|---|---|
| 9,328,964 | B2* | 5/2016 | Shelnutt | H05K 7/20318 |
| 9,622,379 | B1* | 4/2017 | Campbell | H05K 7/20318 |
| 10,492,343 | B2* | 11/2019 | Lei | H01L 25/07 |
| 10,820,447 | B1* | 10/2020 | Miyamura | H05K 7/20236 |
| 11,116,113 | B2* | 9/2021 | Chiu | H05K 7/2039 |
| 12,150,276 | B2* | 11/2024 | Wang | H05K 7/20318 |
| 2006/0067047 | A1* | 3/2006 | Pfahnl | G06Q 20/20 |
| | | | | 361/679.48 |
| 2013/0299232 | A1* | 11/2013 | Fitz-Patrick | B22D 19/0072 |
| | | | | 174/547 |
| 2013/0335920 | A1* | 12/2013 | Murata | H01L 25/112 |
| | | | | 361/699 |
| 2014/0071626 | A1* | 3/2014 | Campbell | B23P 15/26 |
| | | | | 165/165 |
| 2014/0216688 | A1* | 8/2014 | Shelnutt | F28D 15/0266 |
| | | | | 165/104.13 |
| 2017/0354061 | A1* | 12/2017 | Saito | G06F 1/206 |
| 2018/0020571 | A1* | 1/2018 | Saito | H05K 7/20636 |
| 2019/0098796 | A1* | 3/2019 | Wakino | H05K 7/20272 |
| 2024/0015928 | A1* | 1/2024 | Jian | H05K 7/20236 |

OTHER PUBLICATIONS

CN116560476, Zhong et al., A liquid cooling circulation device of super computer main board. (Year: 2023).*

* cited by examiner

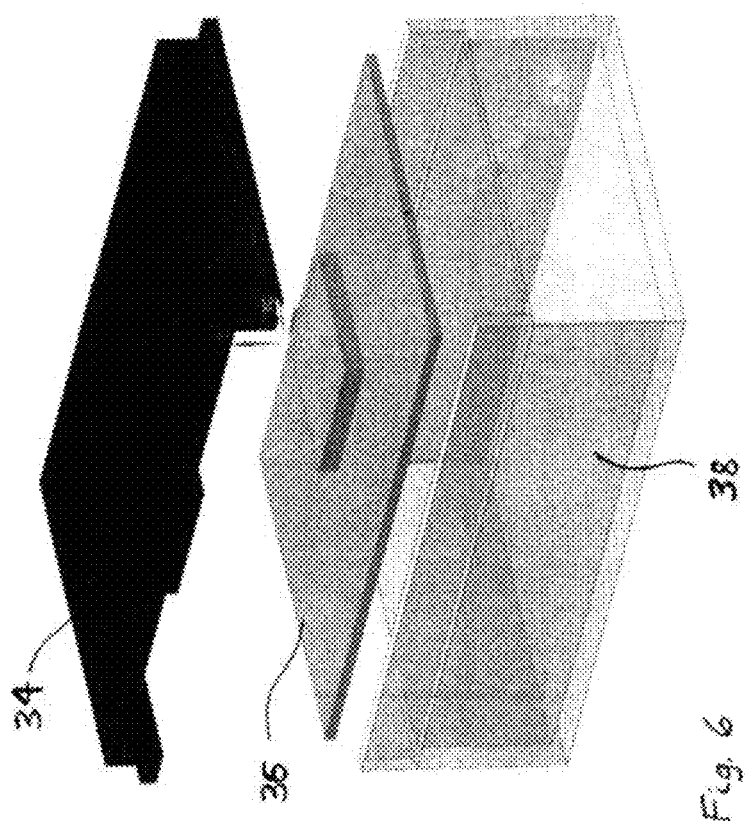

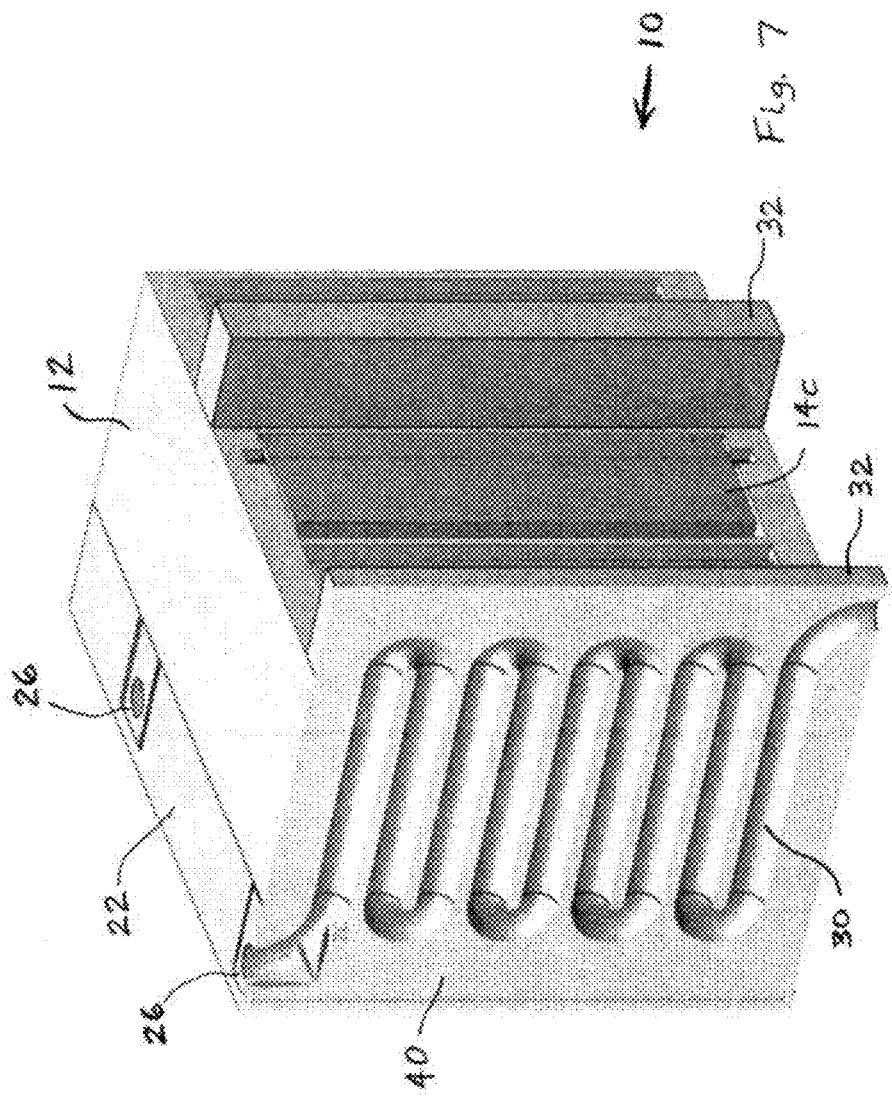

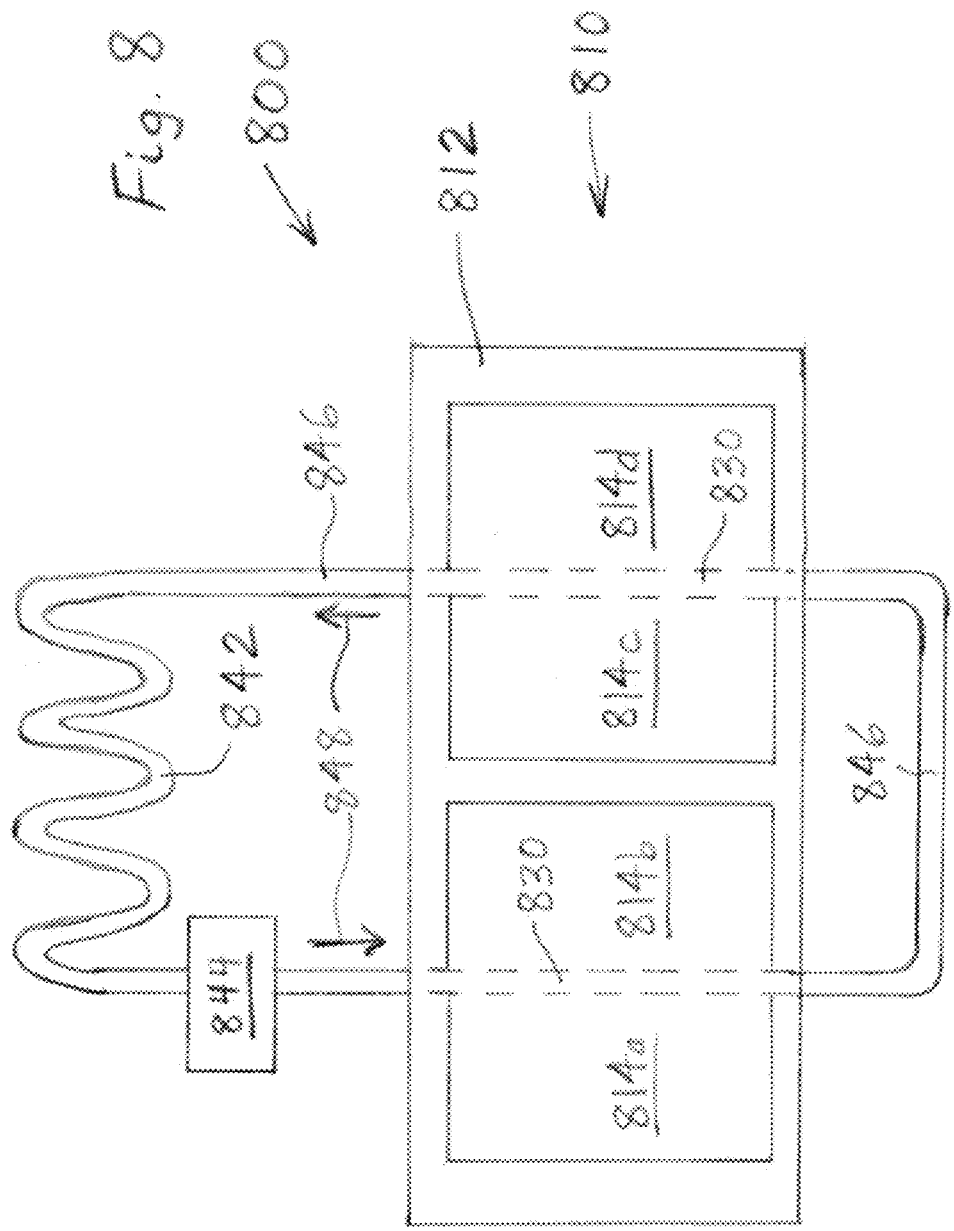

MULTIPLE PCB COOLING MODULE ASSEMBLY

CROSS-REFERENCED TO RELATED APPLICATIONS

This application claims benefit of U.S. Provisional Application No. 63/413,889, filed on Oct. 6, 2022, the disclosure of which is hereby incorporated by reference in its entirety for all purposes.

BACKGROUND OF THE INVENTION

1. Field of the Invention

The present invention relates to drawing heat away from electronics.

2. Description of the Related Art

Currently, other products provide liquid cooling, but can be serviced only by those trained to disassemble electronic hardware. Such other products may use liquid cooling but do not provide protection or ease of disassembly/re-assembly.

SUMMARY OF THE INVENTION

The invention may provide a way to easily cool high-power electronics by circulating liquid through the assembly. There may be a modular enclosure for each printed circuit board (PCB) assembly that is to be cooled. The enclosure may provide mechanical protection for the PCB components and a way to conduct heat to the cold box. The modular enclosures may be installed by sliding them in the cold box where they are pressed against the cooling surface of the cold box by a spring mechanism contained in the cold box. Multiple modular enclosures can be installed in the cold box. The cold box may provide channels for liquid coolant to flow through the walls of the cold box. The cold box can have multiple cooling areas for each modular enclosure.

The invention may enable the easy replacement of modular enclosures while providing a way to conduct heat away from electronics without removing liquid coolant. The invention may be serviced by the end customer who may not have experience with sensitive electronics.

The invention comprises, in one form thereof, a cooling arrangement for electronics, including a plurality of modular electronics enclosures. Each modular electronics enclosure includes at least one electronic component, and a heat sink engaging the electronic component. The cooling arrangement also includes a cold box having a plurality of recesses. Each of the recesses is at least partially defined by at least one corresponding wall having at least one channel therein carrying liquid coolant. Each of the recesses receives a respective one of the modular electronics enclosures. The cold box includes a plurality of springs each biasing a respective heat sink of a respective modular electronics enclosure against a corresponding one of the walls.

The invention comprises, in another form thereof, a cooling arrangement for electronics, including two modular electronics enclosures. Each modular electronics enclosure includes at least one electronic component, and a heat sink engaging the electronic component. A cold box has two recesses. Each of the recesses is at least partially defined by a common wall disposed between the two recesses. The common wall has at least one channel therein carrying liquid coolant. Each of the recesses receives a respective one of the modular electronics enclosures. The cold box includes two springs each biasing a respective heat sink of a respective modular electronics enclosure against a respective side of the common wall.

The invention comprises, in yet another form thereof, a cooling arrangement for electronics, including a plurality of modular electronics enclosures. Each modular electronics enclosure includes at least one electronic component, and a heat sink engaging the electronic component. A cold box has a plurality of recesses. Each of the recesses is at least partially defined by at least one corresponding wall having at least one channel therein carrying liquid coolant. Each of the recesses receives a respective one of the modular electronics enclosures. The cold box includes a plurality of springs each biasing a respective heat sink of a respective modular electronics enclosure against a respective wall. A radiator is in fluid communication with the channel. A pump is in fluid communication with the channel and the radiator. The pump circulates the liquid coolant through the channel and the radiator.

BRIEF DESCRIPTION OF THE DRAWINGS

The above-mentioned and other features and objects of this invention, and the manner of attaining them, will become more apparent and the invention itself will be better understood by reference to the following description of embodiments of the invention taken in conjunction with the accompanying drawings, wherein:

FIG. 6 is a perspective, exploded view of one of the PCB modular enclosures of the multiple cooling module assembly of FIG. 1.

FIG. 7 is a perspective, cross-sectional view of the multiple cooling module assembly of FIG. 2 along line 7-7.

FIG. 8 is a schematic diagram of one embodiment of a cooling arrangement of the present invention for electronics.

DETAILED DESCRIPTION

The embodiments hereinafter disclosed are not intended to be exhaustive or limit the invention to the precise forms disclosed in the following description. Rather the embodiments are chosen and described so that others skilled in the art may utilize its teachings.

Figure 1:
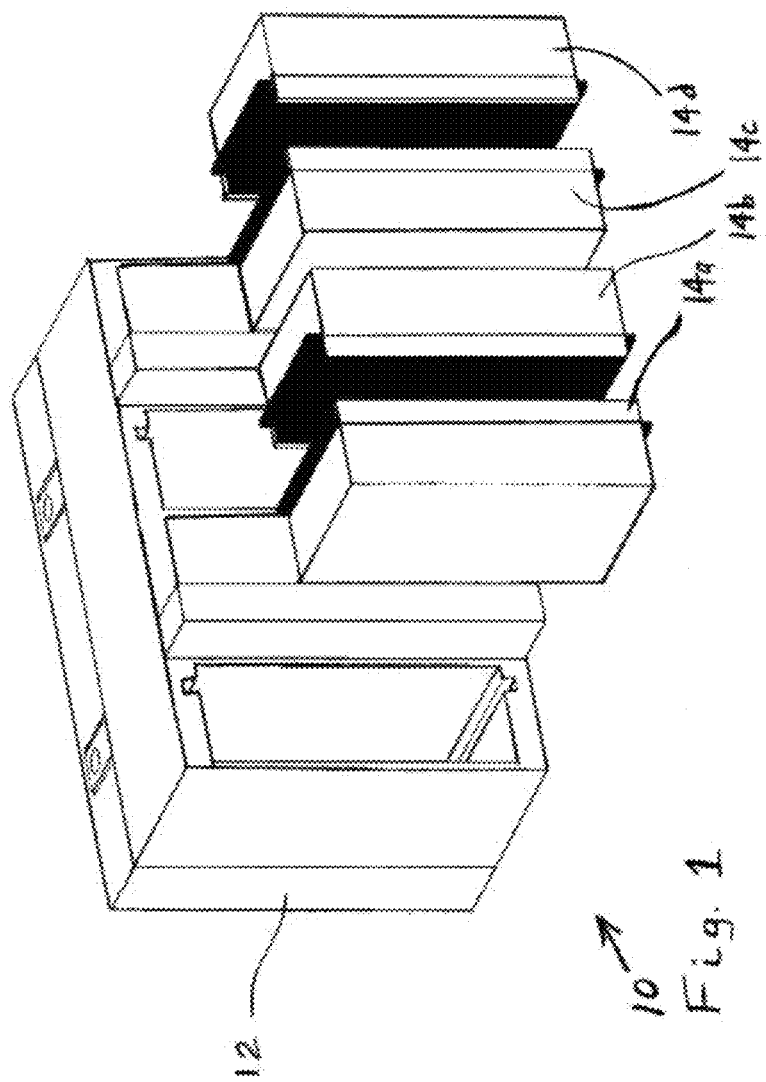
FIG. 1 is a perspective, exploded view of one embodiment of a multiple cooling module assembly of the present invention.
Figure 2:
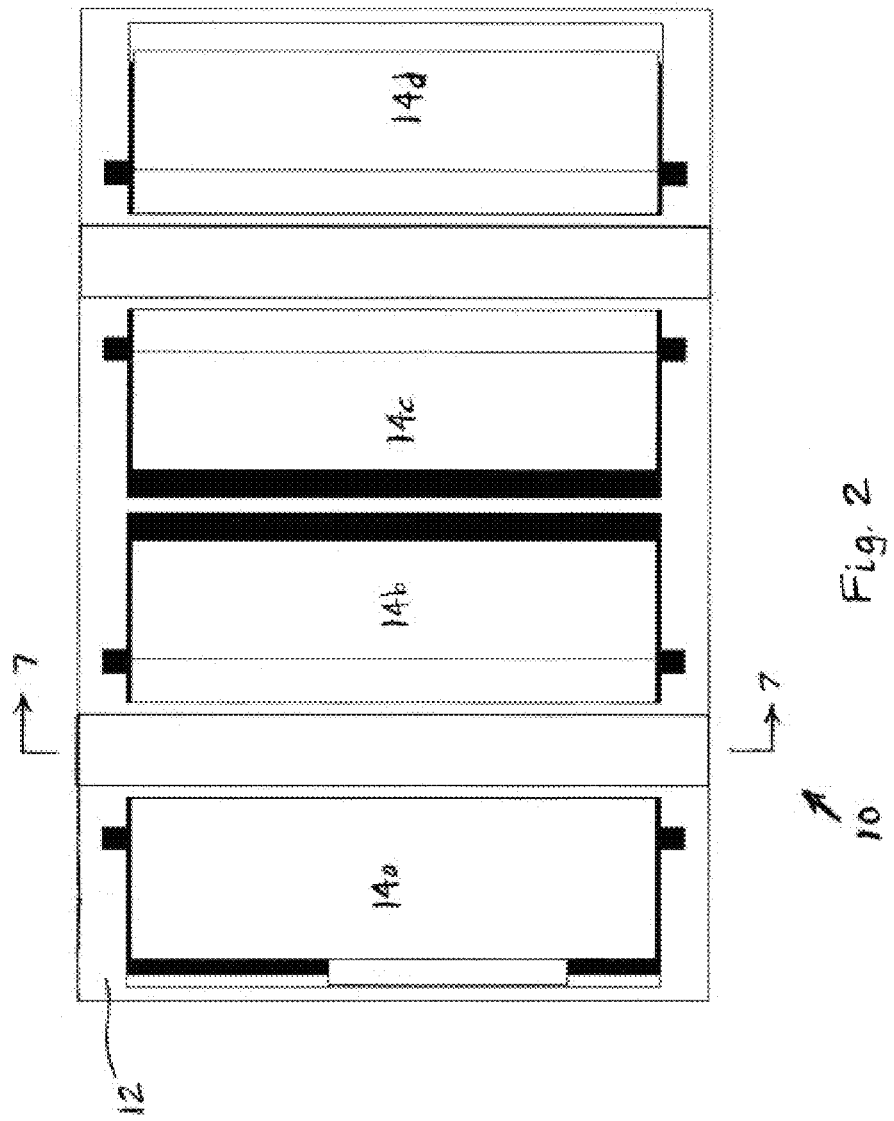
FIG. 2 is a plan view of the multiple cooling module assembly of FIG. 1 in an assembled state.

FIG. 1 illustrates one embodiment of a multiple cooling module assembly 10 of the present invention, including a cold box assembly 12 and four PCB modular enclosures 14a-d. Adjacent PCB modular enclosures 14a-b face each other in order to share the same cooling path. Similarly, adjacent PCB modular enclosures 14c-d face each other in order to share the same cooling path. FIG. 2 shows PCB modular enclosures 14a-d inserted into respective recesses of cold box assembly 12.

Figure 3:
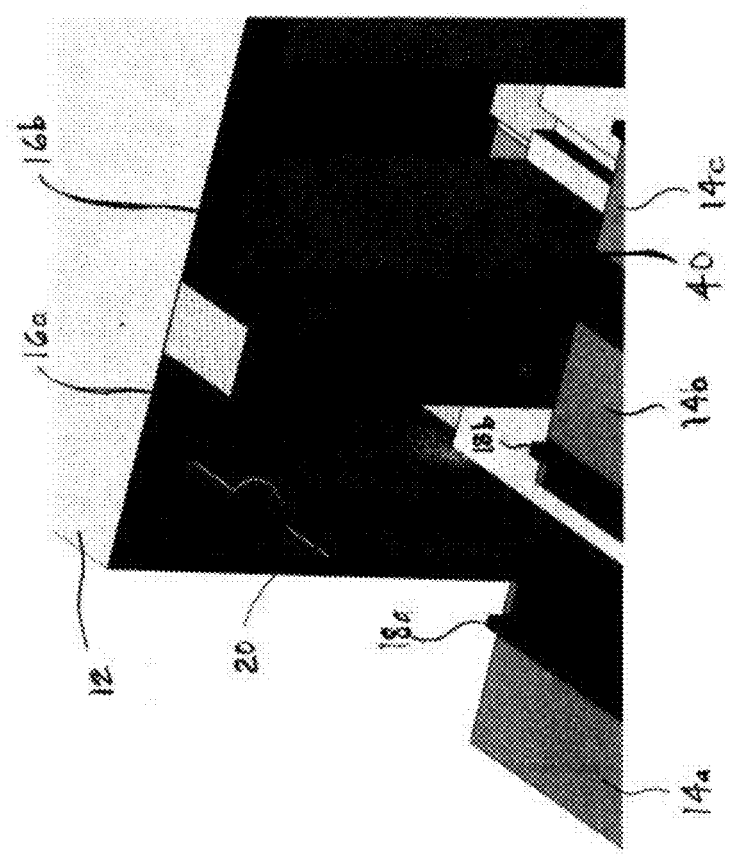
FIG. 3 is a fragmentary, perspective, exploded view of the cold box assembly and three of the PCB modular enclosures of the multiple cooling module assembly of FIG. 1.

FIG. 3 illustrates cold box assembly 12 and PCB modular enclosures 14a-c. Cold box assembly 12 includes insertion guide features in the form of notches 16a-b which receive respective insertion guide features in the form of flanges 18a-b of PCB modular enclosures 14a-b. Cold box assembly 12 includes spring mechanisms 20 each of which provides compression force to a respective PCB modular enclosure 14 to promote heat transfer. Spring mechanisms 20 may each be in the form of a flat spring that is increasingly compressed as the respective PCB modular enclosure 14 is inserted into its respective recess of cold box assembly 12.

Figure 4:
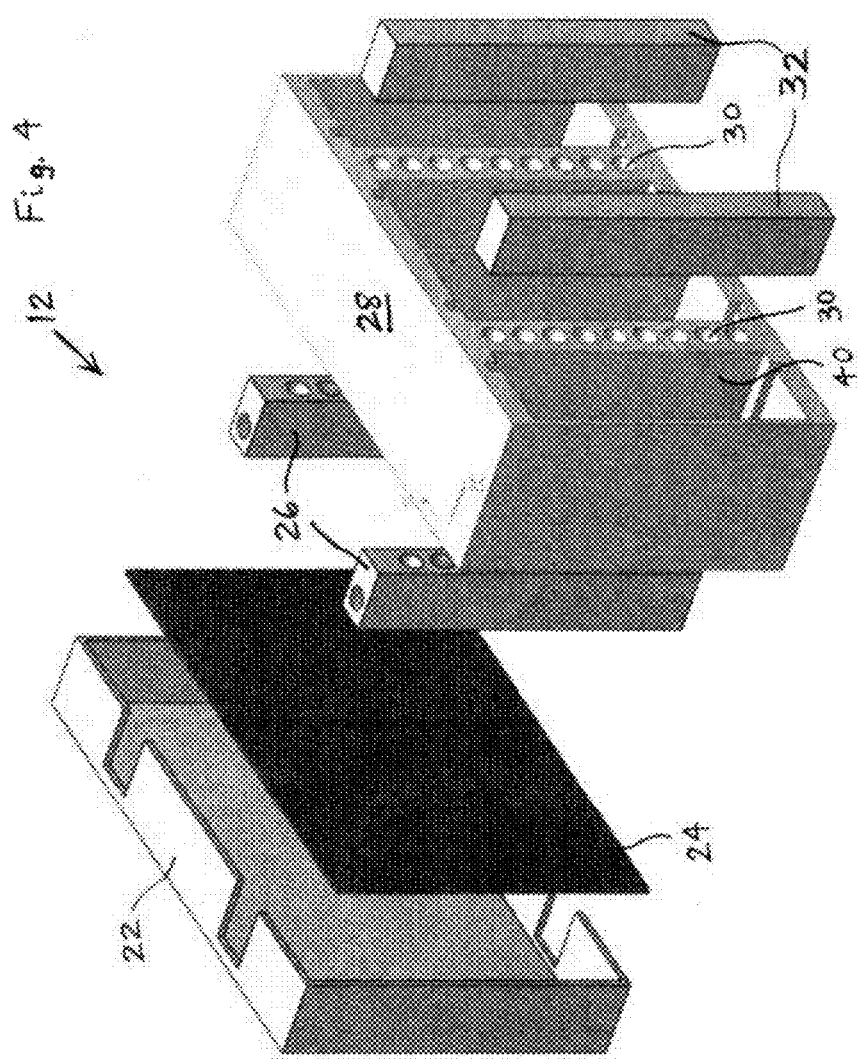
FIG. 4 is a perspective, exploded view of the cold box assembly of the multiple cooling module assembly of FIG. 1.

Cold box assembly 12 includes a rear cover 22 (FIG. 4), a mother board 24, rear manifolds 26 which provide cooling liquid to mother board 24, a cold box 28 having channels 30 for carrying liquid coolant, and front manifolds 32.

Figure 5:
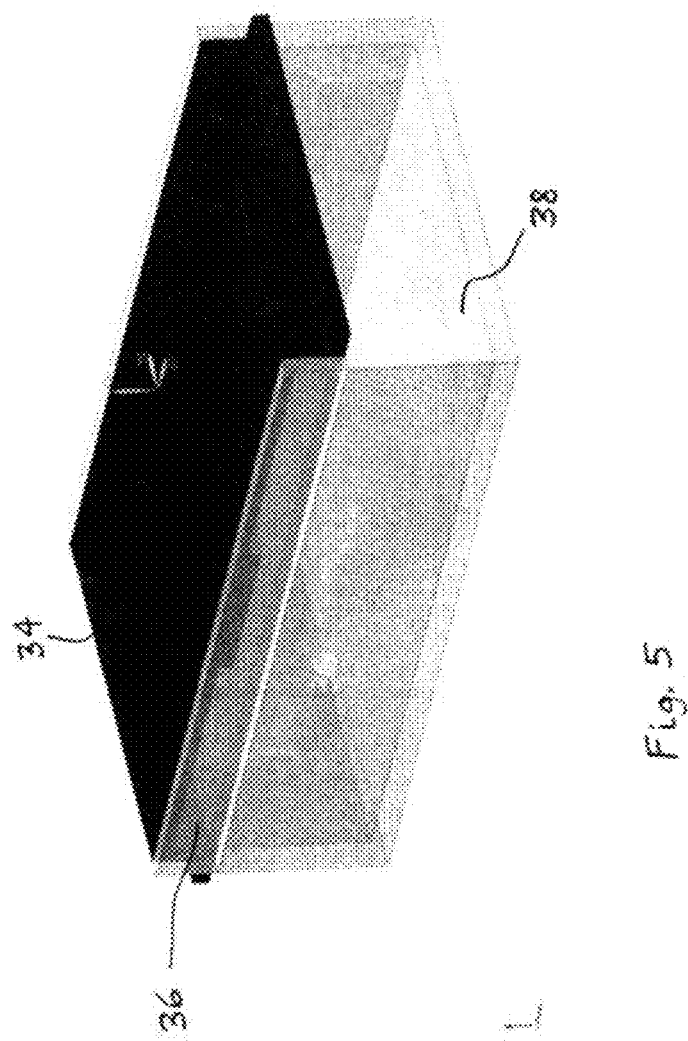
FIG. 5 is a perspective view of one of the PCB modular enclosures of the multiple cooling module assembly of FIG. 1.

Each PCB modular enclosure 14 includes a heat sink 34 (FIGS. 5-6), a PCB assembly 36 and a bottom cover 38. PCB modular enclosure 14 protects PCB assembly 36 and provides heat flow path from heat-generating components on the PCB to heatsink 34. Heat may then be transferred to cold box 28 by contact with one of walls 40 (FIGS. 3-4) having coolant channels 30.

The coolant flow path through channels 30 is shown in FIG. 7 as being a serpentine path going back and forth horizontally through wall 40. However, it is also possible for the coolant flow path through the channels to be a serpentine path going back and forth vertically through the wall. It is further possible for the path to be straight through flow instead of serpentine.

FIG. 8 is a schematic diagram of one embodiment of a cooling arrangement 800 of the present invention for electronics, including a cooling module assembly 810, a radiator 842 and a pump 844. Cooling module assembly 810 includes a cold box assembly 812 with coolant channels 830 and four PCB modular enclosures 814a-d. Cooling module assembly 810 may be substantially similar to cooling module assembly 10, and thus assembly 810 is not described in detail herein in order to avoid needless repetition. PCB modular enclosures 814a-d may be substantially similar to PCB modular enclosures 14a-d, and thus PCB modular enclosures 814a-d are not described in detail herein in order to avoid needless repetition.

During use, pump 844 circulates liquid coolant through conduits 846 and channels 830 in the directions indicated by arrows 846. The liquid coolant absorbs heat while in channels 830, and expels heat while in conduits 846 and particularly while in radiator 842.

The coolant may circulate repeatedly through the wall by operation of a pump (not shown) in a closed circulation path. Included in the closed circulation path may be a radiator (not shown) where the heat carried by the coolant is absorbed by ambient air.

While this invention has been described as having an exemplary design, the present invention may be further modified within the spirit and scope of this disclosure. This application is therefore intended to cover any variations, uses, or adaptations of the invention using its general principles. Further, this application is intended to cover such departures from the present disclosure as come within known or customary practice in the art to which this invention pertains.

What is claimed is:

1. A cooling arrangement for electronics, the arrangement comprising:
    a plurality of modular electronics enclosures, each modular electronics enclosure including:
        at least one electronic component; and
        a heat sink engaging the electronic component; and
    a cold box having a plurality of recesses, each of the recesses being at least partially defined by at least one corresponding wall having at least one channel therein carrying liquid coolant, each of the recesses receiving a respective one of the modular electronics enclosures, the cold box including a plurality of springs each biasing a respective said heat sink of a respective said modular electronics enclosure against a corresponding said wall.

2. The arrangement of claim 1 wherein each said modular electronics enclosure includes a bottom cover, at least one electronic component being disposed between the heat sink and the bottom cover, each said spring of the cold box engaging a respective said bottom cover.

3. The arrangement of claim 1 wherein at least one electronic component includes a printed circuit board.

4. The arrangement of claim 1 wherein each of the recesses includes an elongate notch receiving an elongate flange of the respective one of the modular electronics enclosures.

5. The arrangement of claim 1 wherein each said spring is mounted on a second wall partially defining the recess and opposing the wall having at least one channel therein.

6. The arrangement of claim 1 further comprising a motherboard engaging an edge of the wall having at least one channel therein.

7. The arrangement of claim 1 wherein the spring comprises a flat spring that is configured to be increasingly compressed by the respective modular electronics enclosure as the respective modular electronics enclosure is inserted into its respective said recess of the cold box.

8. A cooling arrangement for electronics, the arrangement comprising:
    two modular electronics enclosures, each modular electronics enclosure including:
        at least one electronic component; and
        a heat sink engaging the electronic component; and
    a cold box having two recesses, each of the recesses being at least partially defined by a common wall disposed between the two recesses, the common wall having at least one channel therein carrying liquid coolant, each of the recesses receiving a respective one of the modular electronics enclosures, the cold box including two springs each biasing a respective said heat sink of a respective said modular electronics enclosure against a respective side of the common wall.

9. The arrangement of claim 8 wherein each said modular electronics enclosure includes a bottom cover, at least one electronic component being disposed between the heat sink and the bottom cover, each said spring of the cold box engaging a respective said bottom cover.

10. The arrangement of claim 8 wherein at least one electronic component includes a printed circuit board.

11. The arrangement of claim 8 wherein each of the recesses includes an elongate notch receiving an elongate flange of the respective one of the modular electronics enclosures.

12. The arrangement of claim 8 wherein each said spring is mounted on a second wall partially defining the recess and opposing the common wall.

13. The arrangement of claim 8 further comprising a motherboard engaging an edge of the common.

14. The arrangement of claim 8 wherein the spring comprises a flat spring that is configured to be increasingly compressed by the respective modular electronics enclosure as the respective modular electronics enclosure is inserted into its respective said recess of the cold box.

15. A cooling arrangement for electronics, the arrangement comprising:
   a plurality of modular electronics enclosures, each modular electronics enclosure including:
      at least one electronic component; and
      a heat sink engaging the electronic component;
   a cold box having a plurality of recesses, each of the recesses being at least partially defined by at least one corresponding wall having at least one channel therein carrying liquid coolant, each of the recesses receiving a respective one of the modular electronics enclosures, the cold box including a plurality of springs each biasing a respective said heat sink of a respective said modular electronics enclosure against a respective said wall;
   a radiator in fluid communication with the channel; and
   a pump in fluid communication with the channel and the radiator, the pump being configured to circulate the liquid coolant through the channel and the radiator.

16. The arrangement of claim 15 wherein each said modular electronics enclosure includes a bottom cover, at least one electronic component being disposed between the heat sink and the bottom cover, each said spring of the cold box engaging a respective said bottom cover.

17. The arrangement of claim 15 wherein each of the recesses includes an elongate notch receiving an elongate flange of the respective one of the modular electronics enclosures.

18. The arrangement of claim 15 wherein each said spring is mounted on a second wall partially defining the recess and opposing the wall having at least one channel therein.

19. The arrangement of claim 15 further comprising a motherboard engaging an edge of the wall having at least one channel therein.

20. The arrangement of claim 15 wherein the spring comprises a flat spring that is configured to be increasingly compressed by the respective modular electronics enclosure as the respective modular electronics enclosure is inserted into its respective said recess of the cold box.

* * * * *